April 3, 1962 E. BELMONT ET AL 3,028,529
SEMICONDUCTOR DIODE
Filed Aug. 26, 1959
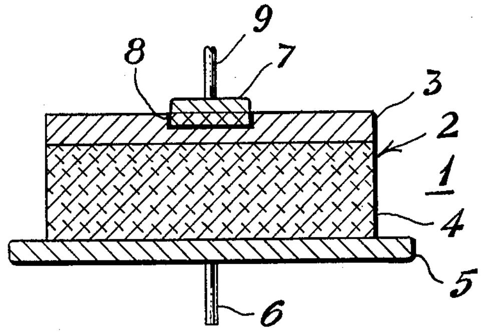
INVENTOR.
EMANUEL BELMONT
CHARLES Z. LEINKRAM
BY [signature]
ATTORNEY 3,028,529
Patented Apr. 3, 1962

3,028,529

SEMICONDUCTOR DIODE

Emanuel Belmont and Charles Z. Leinkram, Asbury, N.J., assignors to The Bendix Corporation, a corporation of Delaware

Filed Aug. 26, 1959, Ser. No. 836,203
5 Claims. (Cl. 317—234)

The present invention relates to semiconductor diodes and more particularly to a semiconductor switching diode.

In some applications it is desirable to have a diode that has an extremely fast switching time with a fast reverse recovery time. In many applications the switching and reverse recovery time of the conventional diodes is too slow to meet the desired requirements.

In order to increase the switching speed and fast recovery time, the present invention provides a diode having a diffused section of low resistivity on the ohmic contact side. This will not affect the reverse characteristic as the space charge will only see the high resistivity section. The forward conduction will be improved as the carriers will be accelerated by the internal field of the graded impurity region. Also, recovery time will improve by virtue of the excess recombination centers available for the minority carriers injected by the forward pulse.

It is an object of the invention to provide an improved semiconductor device.

Another object of the invention is to provide a novel switching diode.

Another object of the device is to provide a semiconductor diode having an exceedingly fast switching time.

Another object of the invention is to provide a diode with a low voltage drop.

Another object of the invention is to provide a semiconductor diode having an improved recovery time.

The above and other objects and features of the invention will appear more fully hereinafter from a consideration of the following description taken in connection with the accompanying drawing wherein one embodiment of the invention is illustrated by way of example.

In the drawing:

The single FIGURE of the drawing is a diagrammatic cross section of semiconductor diode illustrating one embodiment of the invention.

Referring now to the drawing, a semiconductor diode indicated generally by the numeral 1 comprises a wafer 2 of semiconductor material of one type of conductivity having a section 3 of high resistivity and section 4 of low resistivity. The wafer may be prepared utilizing the method described and claimed in co-pending application Serial No. 750,893, filed July 25, 1958. An ohmic contact 5 is secured to the low resistivity section 4 by a conventional method. A lead 6 may be provided for the ohmic contact 5. A portion 7 of material of the opposite type of conductivity is alloyed into the section 3 to form a rectifying junction 8 therewith. A lead 9 may be provided for the portion 7.

For a specific example, a wafer of N type germanium was processed to diffuse antimony into one side of the wafer for a predetermined depth. This formed a NN+ wafer. A metallic ohmic contact was secured to the N+ side of the wafer and an acceptor material comprising an alloy of indium is alloyed into the N section of the wafer. It is understood that the device may be etched and processed in a conventional manner. The diffused section, having a lower resistivity, has a lower voltage drop for a given forward current. The forward recovery time is improved as is the reverse recovery time by a conductivity modulation built in by the N+ layer.

Although only one embodiment of the invention has been illustrated and described, various changes in the form and relative arrangement of the parts, which will now appear to those skilled in the art, may be made without departing from the scope of the invention.

What is claimed is:

1. A semiconductor diode comprising a wafer of semiconductor material of one type of conductivity having a section of low resistance and a section of high resistance, an ohmic contact secured to said low resistance section, and a rectifying junction formed in said high resistance section.

2. A semiconductor diode comprising a wafer of germanium of one conductivity type having antimony diffused to a predetermined depth in one side thereof, an ohmic contact secured to said diffused side, and an alloy of indium alloyed in the other side thereof to form a rectifying junction with said wafer.

3. A semiconductor diode comprising a wafer of a single type conductivity semiconductor material, said wafer having a diffused section to form a low resistance path, an ohmic contact secured to said diffused section, the other portion of said wafer having a higher resistance, and a rectifying junction alloyed in said high resistance portion.

4. A germanium diode having a low voltage drop for a given forward current comprising a wafer of N type germanium having antimony diffused to a predetermined depth in one side thereof, a rectifying junction of an acceptor material alloyed in the other side of said wafer, an ohmic contact secured to said diffused side, and a contact secured to said rectifying junction.

5. A semiconductor diode comprising a wafer of semiconductor material of a single conductivity type, a rectifying junction in said wafer, an ohmic contact, means for providing a low resistance section in said wafer adjacent to said ohmic contact to improve the forward conductance of said diode.

References Cited in the file of this patent

UNITED STATES PATENTS

| | | |
|---|---|---|
| 2,846,340 | Jenny | Aug. 5, 1958 |
| 2,857,527 | Pankove | Oct. 21, 1958 |
| 2,919,389 | Heywang et al. | Dec. 29, 1959 |
| 2,968,751 | Mueller et al. | Jan. 17, 1961 |